US010862517B2

United States Patent
Kim et al.

(10) Patent No.: US 10,862,517 B2
(45) Date of Patent: Dec. 8, 2020

(54) DIGITAL COMPENSATOR

(71) Applicant: NanoSemi, Inc., Waltham, MA (US)

(72) Inventors: Helen H. Kim, Sudbury, MA (US); Alexandre Megretski, Concord, MA (US); Yan Li, Lexington, MA (US); Kevin Chuang, Cambridge, MA (US); Zohaib Mahmood, Westwood, MA (US)

(73) Assignee: NanoSemi, Inc., Waltham, MA (US)

( * ) Notice: Subject to any disclaimer, the term of this patent is extended or adjusted under 35 U.S.C. 154(b) by 0 days.

(21) Appl. No.: 16/556,659

(22) Filed: Aug. 30, 2019

(65) Prior Publication Data

US 2020/0067543 A1 Feb. 27, 2020

Related U.S. Application Data

(63) Continuation of application No. 15/992,614, filed on May 30, 2018, now Pat. No. 10,404,296, which is a
(Continued)

(51) Int. Cl.
*H04B 1/04* (2006.01)
*H04L 12/24* (2006.01)
*H03F 1/32* (2006.01)

(52) U.S. Cl.
CPC ......... *H04B 1/0475* (2013.01); *H03F 1/3241* (2013.01); *H03F 1/3252* (2013.01);
(Continued)

(58) Field of Classification Search
CPC .......... H04B 2001/0425; H04B 1/0475; H04L 41/0654; H03F 1/3258; H03F 1/3252; H03F 1/3241
See application file for complete search history.

(56) References Cited

U.S. PATENT DOCUMENTS

| 4,979,126 A | 12/1990 | Pao et al. |
| 5,819,165 A | 10/1998 | Hulkko et al. |

(Continued)

FOREIGN PATENT DOCUMENTS

| CN | 101379718 A | 3/2009 |
| CN | 101971507 A | 2/2011 |

(Continued)

OTHER PUBLICATIONS

Aguirre, et al., "On the Interpretation and Practice of Dynamical Differences Between Hammerstein and Wiener Models", IEEE Proceedings on Control TheoryAppl; vol. 152, No. 4, Jul. 2005, pp. 349-356.

(Continued)

*Primary Examiner* — Vineeta S Panwalkar
(74) *Attorney, Agent, or Firm* — Occhiuti & Rohlicek LLP

(57) ABSTRACT

An approach to digital compensation uses a particular structure for a digital pre-distorter (DPD) which acts as a relatively accurate pre-inverse of a non-linear circuit (e.g., a non-linear transmit chain involving digital-to-analog converter (DAC), lowpass filter, modulator, bandpass filter, and power amplifier) while making use of a relatively small number of parameters that characterize the non-linearity and/or parameters that provide accurate linearization without requiring continual updating.

18 Claims, 7 Drawing Sheets

Related U.S. Application Data continuation of application No. PCT/US2016/064127, filed on Nov. 30, 2016, which is a continuation of application No. 14/953,762, filed on Nov. 30, 2015, now Pat. No. 9,590,668.

(52) U.S. Cl.
CPC ....... *H03F 1/3258* (2013.01); *H04L 41/0654* (2013.01); *H04B 2001/0425* (2013.01)

(56) References Cited

U.S. PATENT DOCUMENTS

| | | |
|---|---|---|
| 5,980,457 A | 11/1999 | Averkiou |
| 6,052,412 A | 4/2000 | Ruether et al. |
| 6,240,278 B1 | 5/2001 | Midya et al. |
| 6,288,610 B1 | 9/2001 | Miyashita |
| 7,289,773 B2 | 10/2007 | Braithwaite |
| 7,295,815 B1 | 11/2007 | Wright et al. |
| 7,333,557 B2 | 2/2008 | Rashev et al. |
| 7,529,652 B1 | 5/2009 | Gahinet et al. |
| 7,599,431 B1 | 10/2009 | Anderson et al. |
| 7,904,033 B1 | 3/2011 | Wright et al. |
| 8,185,066 B2 | 5/2012 | Camp, Jr. et al. |
| 8,391,809 B1 | 3/2013 | Fuller |
| 8,411,730 B2 | 4/2013 | Maeda |
| 8,446,979 B1 | 5/2013 | Yee |
| 8,498,590 B1 | 7/2013 | Rashev et al. |
| 8,519,789 B2 | 8/2013 | Hawkes |
| 8,576,941 B2 | 11/2013 | Bai |
| 8,644,437 B2 | 2/2014 | Kim et al. |
| 8,711,976 B2 | 4/2014 | Chandrasekaran |
| 8,731,005 B2 | 5/2014 | Schlee |
| 8,731,105 B2 | 5/2014 | Bai |
| 9,130,628 B1 | 9/2015 | Mittal et al. |
| 9,173,173 B2 | 10/2015 | Wei et al. |
| 9,184,710 B2 | 11/2015 | Braithwaite |
| 9,226,189 B1 | 12/2015 | Kularatna et al. |
| 9,252,712 B2 | 2/2016 | Li et al. |
| 9,331,882 B2 | 5/2016 | Fehri et al. |
| 9,337,782 B1 | 5/2016 | Mauer et al. |
| 9,564,876 B2 | 2/2017 | Kim et al. |
| 9,590,668 B1 | 3/2017 | Kim et al. |
| 9,595,920 B2 | 3/2017 | Li et al. |
| 9,614,557 B1 | 4/2017 | Mayer et al. |
| 9,628,119 B2 | 4/2017 | Gal et al. |
| 9,749,161 B1 | 8/2017 | Gal et al. |
| 9,935,810 B1 | 4/2018 | Hammler et al. |
| 9,973,370 B1 | 5/2018 | Langer et al. |
| 10,033,413 B2 | 7/2018 | Pratt |
| 10,079,699 B1 | 9/2018 | Li et al. |
| 10,080,178 B2 | 9/2018 | Stapleton et al. |
| 10,141,896 B2 | 11/2018 | Huang |
| 10,141,961 B1 | 11/2018 | Huang et al. |
| 10,181,914 B2 * | 1/2019 | Li ..................... H04B 17/13 |
| 10,404,296 B2 | 9/2019 | Kim et al. |
| 10,447,511 B2 | 10/2019 | Xie et al. |
| 10,469,109 B2 | 11/2019 | Gutman et al. |
| 10,523,159 B2 | 12/2019 | Megretski et al. |
| 10,581,470 B2 | 3/2020 | Megretski et al. |
| 10,644,657 B1 | 5/2020 | Megretski et al. |
| 2001/0050592 A1 | 12/2001 | Wright et al. |
| 2002/0080891 A1 | 6/2002 | Ahn et al. |
| 2003/0058960 A1 | 3/2003 | Lee |
| 2003/0184374 A1 | 10/2003 | Huang et al. |
| 2003/0207680 A1 | 11/2003 | Yang et al. |
| 2004/0076247 A1 | 4/2004 | Barak et al. |
| 2004/0116083 A1 | 6/2004 | Suzuki et al. |
| 2004/0142667 A1 | 7/2004 | Lochhead et al. |
| 2004/0196922 A1 | 10/2004 | Leffel |
| 2005/0001684 A1 | 1/2005 | Braithwaite |
| 2005/0163251 A1 | 7/2005 | McCallister |
| 2005/0163252 A1 | 7/2005 | McCallister et al. |
| 2005/0180527 A1 | 8/2005 | Suzuki et al. |
| 2005/0190857 A1 | 9/2005 | Braithwaite |
| 2006/0022751 A1 | 2/2006 | Fuller et al. |
| 2006/0154622 A1 | 7/2006 | Piirainen |
| 2006/0229036 A1 | 10/2006 | Muller et al. |
| 2006/0276147 A1 | 12/2006 | Suzuki |
| 2007/0091992 A1 | 4/2007 | Dowling |
| 2007/0230557 A1 | 10/2007 | Balasubramonian et al. |
| 2007/0241812 A1 | 10/2007 | Yang et al. |
| 2008/0003945 A1 | 1/2008 | Wenham |
| 2008/0019453 A1 | 1/2008 | Zhao et al. |
| 2008/0039045 A1 | 2/2008 | Filipovic et al. |
| 2008/0057882 A1 | 3/2008 | Singerl |
| 2008/0101502 A1 | 5/2008 | Navidpour et al. |
| 2008/0247487 A1 | 10/2008 | Cai et al. |
| 2008/0268795 A1 | 10/2008 | Saed |
| 2008/0285640 A1 | 11/2008 | McCallister |
| 2009/0201084 A1 | 8/2009 | See et al. |
| 2010/0026354 A1 | 2/2010 | Utsunomiya et al. |
| 2010/0048149 A1 | 2/2010 | Tang et al. |
| 2010/0225390 A1 | 9/2010 | Brown et al. |
| 2011/0044158 A1 | 2/2011 | Tao et al. |
| 2011/0085490 A1 | 4/2011 | Schlee |
| 2011/0098011 A1 | 4/2011 | Camp, Jr. et al. |
| 2011/0128992 A1 | 6/2011 | Maeda et al. |
| 2011/0135035 A1 | 6/2011 | Bose et al. |
| 2011/0150130 A1 | 6/2011 | Kenington |
| 2011/0163806 A1 | 7/2011 | Hongo |
| 2011/0187437 A1 | 8/2011 | Perreault et al. |
| 2011/0235734 A1 | 9/2011 | Kenington |
| 2011/0255627 A1 | 10/2011 | Gotman et al. |
| 2011/0273234 A1 | 11/2011 | Van der Heijen et al. |
| 2011/0273236 A1 | 11/2011 | Heijden et al. |
| 2012/0093210 A1 | 4/2012 | Schmidt et al. |
| 2012/0108189 A1 | 5/2012 | McCallister et al. |
| 2012/0119810 A1 | 5/2012 | Bai |
| 2012/0119811 A1 | 5/2012 | Bai et al. |
| 2012/0119831 A1 | 5/2012 | Bai |
| 2012/0154033 A1 | 6/2012 | Lozhkin |
| 2012/0154430 A1 | 6/2012 | Matsushima et al. |
| 2012/0176195 A1 | 7/2012 | Dawson et al. |
| 2012/0200355 A1 | 8/2012 | Braithwaite |
| 2012/0219048 A1 | 8/2012 | Camuffo et al. |
| 2012/0286865 A1 | 11/2012 | Chandrasekaran |
| 2012/0286985 A1 | 11/2012 | Chandrasekaran et al. |
| 2012/0293252 A1 | 11/2012 | Sorrells et al. |
| 2012/0295558 A1 | 11/2012 | Wang et al. |
| 2013/0033317 A1 | 2/2013 | Hawkes |
| 2013/0034188 A1 | 2/2013 | Rashev et al. |
| 2013/0044791 A1 | 2/2013 | Rimini et al. |
| 2013/0094610 A1 | 4/2013 | Ghannouchi et al. |
| 2013/0094612 A1 | 4/2013 | Kim et al. |
| 2013/0163512 A1 | 6/2013 | Rexberg et al. |
| 2013/0251065 A1 | 9/2013 | Bai |
| 2013/0259159 A1 | 10/2013 | McCallister et al. |
| 2013/0329833 A1 | 12/2013 | Bai |
| 2014/0038659 A1 | 2/2014 | Wei et al. |
| 2014/0161159 A1 | 6/2014 | Black et al. |
| 2014/0161207 A1 | 6/2014 | Teterwak |
| 2014/0177695 A1 | 6/2014 | Cha et al. |
| 2014/0187182 A1 | 7/2014 | Yan et al. |
| 2014/0254716 A1 | 9/2014 | Zhou et al. |
| 2014/0274105 A1 | 9/2014 | Wang |
| 2014/0292579 A1 | 10/2014 | Oh et al. |
| 2014/0347126 A1 | 11/2014 | Laporte et al. |
| 2015/0043313 A1 | 2/2015 | Stranczl et al. |
| 2015/0043323 A1 | 2/2015 | Choi et al. |
| 2015/0043678 A1 | 2/2015 | Hammi |
| 2015/0049841 A1 | 2/2015 | Laporte et al. |
| 2015/0061761 A1 | 3/2015 | Wills et al. |
| 2015/0103952 A1 | 4/2015 | Wang et al. |
| 2015/0123735 A1 | 5/2015 | Wimpenny |
| 2015/0124907 A1 | 5/2015 | Li et al. |
| 2015/0171768 A1 | 6/2015 | Perreault |
| 2015/0325913 A1 | 11/2015 | Vagman |
| 2015/0326349 A1 | 11/2015 | Yang et al. |
| 2015/0333781 A1 | 11/2015 | Alon et al. |
| 2015/0357975 A1 | 12/2015 | Avniel et al. |
| 2015/0358039 A1 | 12/2015 | Xiong et al. |
| 2015/0381216 A1 | 12/2015 | Shor et al. |
| 2015/0381220 A1 | 12/2015 | Gal et al. |
| 2016/0028433 A1 | 1/2016 | Ding et al. |

(56) References Cited

U.S. PATENT DOCUMENTS

| | | |
|---|---|---|
| 2016/0065147 A1 | 3/2016 | Pratt et al. |
| 2016/0087604 A1 | 3/2016 | Kim et al. |
| 2016/0094253 A1 | 3/2016 | Weber et al. |
| 2016/0095110 A1 | 3/2016 | Li et al. |
| 2016/0100180 A1 | 4/2016 | Oh |
| 2016/0112222 A1 | 4/2016 | Pashay-Kojouri |
| 2016/0174118 A1 | 6/2016 | Duan et al. |
| 2016/0191020 A1 | 6/2016 | Velazquez |
| 2016/0211577 A1 | 7/2016 | Miller et al. |
| 2016/0241277 A1 | 8/2016 | Rexberg et al. |
| 2016/0249300 A1 | 8/2016 | Tsai et al. |
| 2017/0005627 A1 | 1/2017 | Zhao et al. |
| 2017/0077981 A1 | 3/2017 | Tobisu et al. |
| 2017/0176507 A1 | 6/2017 | O'Keeffe et al. |
| 2017/0237455 A1 | 8/2017 | Ye et al. |
| 2017/0302233 A1 | 10/2017 | Huang |
| 2019/0007075 A1 | 1/2019 | Kim et al. |
| 2019/0104000 A1 | 4/2019 | Xie et al. |
| 2019/0348956 A1 | 11/2019 | Megretski et al. |
| 2019/0363676 A1 | 11/2019 | Megretski et al. |
| 2019/0363742 A1 | 11/2019 | Megretski et al. |
| 2020/0028476 A1 | 1/2020 | Kim et al. |
| 2020/0067543 A1 | 2/2020 | Kim et al. |

FOREIGN PATENT DOCUMENTS

| | | |
|---|---|---|
| CN | 104796170 A | 7/2015 |
| CN | 104871433 A | 8/2015 |
| CN | 105634539 A | 6/2016 |
| CN | 106464280 A | 2/2017 |
| EP | 0916967 A2 | 5/1999 |
| EP | 1560329 A1 | 8/2005 |
| EP | 1732208 A1 | 12/2006 |
| EP | 2991221 A1 | 3/2016 |
| JP | 2005-065211 A | 3/2005 |
| JP | 2010-136123 A | 6/2010 |
| JP | 2013-542696 A | 11/2013 |
| JP | 2014-533017 A | 12/2014 |
| WO | 20120154430 A1 | 11/2012 |
| WO | 2015107392 A1 | 7/2015 |
| WO | 2019031714 A1 | 2/2019 |

OTHER PUBLICATIONS

Barradas, et al. "Polynomials and LUTs in PA Behavioral Modeling: A Fair Theoretical Comparison", IEEE Transactions on Microwave Theory and Techniques; vol. 62, No. 12, Dec. 2014, pp. 3274-3285.

Bosch et al. "Measurement and Simulation of Memory Effects in Predistortion Linearizers," IEEE Transactions on Mircrowave Theory and Techniques; vol. 37.No. 12; Dec. 1989, pp. 1885-1890.

Braithwaite, et al. "Closed-Loop Digital Predistortion (DPD) Using an Observation Path with Limited Bandwidth" IEEE Transactions on Microwave Theory and Techniques; vol. 63, No. 2; Feb. 2015, pp. 726-736.

Cavers, "Amplifier Linearization Using a Digital Predistorter with Fast Adaption and Low Memory Requirements;" IEEE Transactions on Vehicular Technology; vol. 39; No. 4; Nov. 1990, pp. 374-382.

D'Andrea et al., "Nonlinear Predistortion of OFDM Signals over Frequency-Selective Fading Channels," IEEE Transactions on Communications; vol. 49; No. 5, May 2001; pp. 837-843.

Guan, et al. "Optimized Low-Complexity Implementation of Least Squares Based Model Extraction of Digital Predistortion of RF Power Amplifiers", IEEE Transactions on Microwave Theory and Techniques; vol. 60, No. 3, Mar. 2012; pp. 594-603.

Henrie, et al., "Cancellation of Passive Intermodulation Distortion in Microwave Networks", Proceedings of the 38.sup.th European Microwave Conference, Oct. 2008, Amsterdam, The Netherlands, pp. 1153-1156.

Hong et al., "Weighted Polynomial Digital Predistortion for Low Memory Effect Doherty Power Amplifier," IEEE Transactions on Microwave Theory and Techniques; vol. 55; No. 5, May 2007, pp. 925-931.

Kwan, et al., "Concurrent Multi-Band Envelope Modulated Power Amplifier Linearized Using Extended Phase-Aligned DPD", IEEE Transactions on Microwave Theory and Techniques; vol. 62, No. 12, Dec. 2014, pp. 3298-3308.

Lajoinie et al. Efficient Simulation of NPR for the Optimum Design of Satellite Transponders SSPAs, EEE MTT-S International; vol. 2; Jun. 1998; pp. 741-744.

Li et al. "High-Throughput Signal Component Separator for Asymmetric Multi-Level Outphasing Power Amplifiers," IEEE Journal of Solid-State Circuits; vol. 48; No. 2; Feb. 2013; pp. 369-380.

Liang, et al. "A Quadratic-Interpolated Lut-Based Digital Predistortion Techniques for Cellular Power Amplifiers", IEEE Transactions on Circuits and Systems; II: Express Briefs, vol. 61, No. 3, Mar. 2014; pp. 133-137.

Liu, et al. "Digital Predistortion for Concurrent Dual-Band Transmitters Using 2-D Modified Memory Polynomials", IEEE Transactions on Microwave Theory and Techniques, vol. 61, No. 1, Jan. 2013, pp. 281-290.

Molina, et al. "Digital Predistortion Using Lookup Tables with Linear Interpolation and Extrapolation: Direct Least Squares Coefficient Adaptation", IEEE Transactions on Microwave Theory and Techniques, vol. 65, No. 3, Mar. 2017; pp. 980-987.

Morgan, et al. "A Generalized Memory Polynomial Model for Digital Predistortion of RF Power Amplifiers," IEEE Transactions of Signal Processing; vol. 54; No. 10; Oct. 2006; pp. 3852-3860.

Naraharisetti, et a., "2D Cubic Spline Implementation for Concurrent Dual-Band System", IEEE, 2013, pp. 1-4.

Naraharisetti, et al. "Efficient Least-Squares 2-D-Cubic Spline for Concurrent Dual-Band Systems", IEEE Transactions on Microwave Theory and Techniques, vol. 63; No. 7, Jul. 2015; pp. 2199-2210.

Muta et al., "Adaptive predistortion linearization based on orthogonal polynomial expansion for nonlinear power amplifiers in OFDM systems", Communications and Signal Processing (ICCP), International Conference on, IEEE, pp. 512-516, 2011.

Panigada, et al. "A 130 mW 100 MS/s Pipelined ADC with 69 SNDR Enabled by Digital Harmonic Distortion Correction," IEEE Journal of Solid-State Circuits; vol. 44; No. 12; Dec. 2009, pp. 3314-3328.

Peng, et al. "Digital Predistortion for Power Amplifier Based on Sparse Bayesian Learning", IEEE Transactions on Circuits and Systems, II: Express Briefs; 2015, pp. 1-5.

Quindroit et al. "FPGA Implementation of Orthogonal 2D Digital Predistortion System for Concurrent Dual-Band Power Amplifiers Based on Time-Division Multiplexing", IEEE Transactions on Microwave Theory and Techniques; vol. 61; No. 12, Dec. 2013, pp. 4591-4599.

Rawat, et al. "Adaptive Digital Predistortion of Wireless Power Amplifiers/Transmitters Using Dynamic Real-Valued Focused Time-Delay Line Neural Networks", IEEE Transactions on Microwave Theory and Techniques; vol. 58, No. 1; Jan. 2010; pp. 95-104.

Safari, et a., "Spline-Based Model for Digital Predistortion of Wide-Band Signals for High Power Amplifier Linearization", IEEE; 2007, pp. 1441-1444.

Sevic, et al. "A Novel Envelope-Termination Load-Pull Method of ACPR Optimization of RF/Microwave Power Amplifiers," IEEE MTT-S International; vol. 2, Jun. 1998; pp. 723-726.

Tai, "Efficient Watt-Level Power Amplifiers in Deeply Scaled CMOS, " Ph.D. Dissertation; Carnegie Mellon University; May 2011; 129 pages.

Tehran, et al. "Modeling of Long Term Memory Effects in RF Power Amplifiers with Dynamic Parameters", IEEE; 2012, pp. 1-3.

Yu et al. "A Generalized Model Based on Canonical Piecewise Linear Functions for Digital Predistortion", Proceedings of the Asia-Pacific Microwave Conference; 2016, pp. 1-4.

Yu, et al. "Band-Limited Volterra Series-Based Digital Predistortion for Wideband RF Power Amplifiers," IEEE Transactions of Microwave Theory and Techniques; vol. 60; No. 12; Dec. 2012, pp. 4198-4208.

Yu, et al."Digital Predistortion Using Adaptive Basis Functions", IEEE Transations on Circuits and Systems—I. Regular Papers; vol. 60, No. 12; Dec. 2013, pp. 3317-3327.

Zhang et al. "Linearity Performance of Outphasing Power Amplifier Systems," Design of Linear Outphasing Power Amplifiers; Google

(56) References Cited

OTHER PUBLICATIONS e-book; 2003; Retrieved on Jun. 13, 2014; Retrieved from Internet <URL:http:www.artechhouse.com/uploads/public/documents/chapters/Zhang-LarsonCH- 2.pdf; pp. 35-85.

Zhu et al. "Digital Predistortion for Envelope-Tracking Power Amplifiers Using Decomposed Piecewise Volterra Sereis," IEEE Transactions on Microwave Theory and Techniques; vol. 56; No. 10; Oct. 2008; pp. 2237-2247.

Cidronali, A., I. Magrini, R. Fagotti, and G. Manes. "A new approach for concurrent dual-band IF digital predistortion: System design and analysis." In 2008 Workshop on Integrated Nonlinear Microwave and Millimetre-Wave Circuits, pp. 127-130. IEEE, 2008.

Henrie, Justin, Andrew Christianson, and William J. Chappell. "Cancellation of passive intermodulation distortion in microwave networks." In Microwave Conference, 2008. EuMC 2008. 38th European, pp. 1153-1156. IEEE, 2008.

Riihonen et al., "Mitigation of Loopback Self-Interference in Full-Duplex Mimo Relays" IEEE Transactions on Signal Processing, 59(12), 5983-5993, Dec. 2011.

\* cited by examiner

DIGITAL COMPENSATOR

CROSS REFERENCE TO RELATED APPLICATIONS

This application is a continuation of U.S. application Ser. No. 15/992,614, filed on May 30, 2018, which is a continuation of International Application PCT/US2016/064127, filed on Nov. 30, 2016, which is a continuation of U.S. application Ser. No. 14/953,762, filed Nov. 30, 2015, the entire content of which is incorporated herein by reference.

BACKGROUND

This invention relates to digital compensation of a non-linear circuit, and in particular, to linearization of a non-linear power amplifier and transmitter chain.

A concept of applying a digital compensation to restore the quality of an original signal passed through a circuit is a routine. A power amplifier in a radio of a wireless base station or handset is compensated digitally in the baseband to minimize the spectral leakage into adjacent channels. An audio amplifier in a speaker is compensated digitally to achieve high fidelity. In many such examples, variants of Volterra series have been adopted to account for dynamical nature of nonlinearity. Wiener, Wiener-Hammerstein, General Memoryless Polynomial are popular structures for digital pre-distorters, which are used to modify an input signal prior to passing through a non-linear circuit. In general, these structures have an exponential complexity if the polynomial order exceeds 3 to 5, as well as robustness issues due to sensitivity of compensator parameters to variations of a particular device (Device Under Test, DUT), including process, temperature, supply voltage, and other operating conditions.

Referring to FIG. 1, in an example of a linearization of a radio power amplifier, a digital input signal x[n] at a baseband or intermediate frequency is passed through a Digital Pre-Distorter (DPD) 110 to produce a "pre-distorted" input y[n], which is passed through a transmit chain 140 to produce a driving signal p(t) that drives an antenna 150. The transmit chain may include a Digital-to-Analog Converter (DAC) 142, an analog lowpass filter (LPF) 144, and a modulator (e.g., multiplication by a local oscillator) of the output of the LPF 144. The output of the modulator is passed to a power amplifier (PA) 148. The PA 148, as well as other elements in the transmit chain, may introduce non-linearities, which may be manifested in the driving signal p(t) as harmonic and/or intermodulation distortion of the input signal x[n]. To overcome these nolinearities, the DPD 110 also introduces non-linearities that are intended to "pre-invert" (i.e. pre-distort) the non-linear effects of the transmit chain. In some examples, the DPD performs the transformation of the desired signal x[n] to the input y[n] of the transmit chain by using delay elements 120 to form a set of delayed versions of the desired signal, and then using a non-linear polynomial function 130 of those delayed inputs. In some examples, the non-linear function is a Volterra series:

$$y[n] = h_0 + \Sigma_p \Sigma_{\tau_1,\ldots,\tau_p} h_p(\tau_1,\ldots,\tau_p) \Pi_{j=1\ldots p} x[n-\tau_j]$$

In some examples, the non-linear function is reduced set of Volterra terms, for example a delay polynomial:

$$y[n] = h_0 + \Sigma_p \Sigma_\tau h_p(\tau) x[n-\tau] |x[n-\tau]|^{(p-1)}$$

In order to invert the non-linear effects of the transmit chain, in general, a relatively large number of terms of such a series representation are needed, and the coefficients of those terms (e.g., the $h_p$ terms) must be accurately set. In general, the coefficients in such approaches are continually updated to maintain good linearization. Various approaches to such continual updating are used, for example, based on incremental updates using y[n] and observation of p(t) (e.g., after demodulation).

SUMMARY

In a general aspect, an approach to digital compensation uses a particular structure for a digital pre-distorter (DPD) which acts as a relatively accurate pre-inverse of a non-linear circuit (e.g., a non-linear transmit chain involving digital-to-analog converter (DAC), lowpass filter, modulator, bandpass filter, and power amplifier) while making use of a relatively small number of parameters that characterize the non-linearity and/or parameters that provide accurate linearization without requiring continual updating.

In general, this approach is more closely related to the underlying sources of non-linearity arising from the modulation and subsequent (e.g., non-linear) amplification of the modulated signal. In particular, the approach more directly captures harmonic and intermodulation distortion effects without requiring a large number of parameters.

In one aspect, in general, a pre-distorter implements an overall non-linear transformation of a sampled input signal u[n] (e.g., an upsampled version of a baseband encoding of a desired signal to be transmitted) to yield an input y[m] to a transmit chain. The overall non-linear transformation is implemented using a combination of time filtered versions of linear and non-linear functions of the input signal. In this description, these time filtered versions are referred to as basis functions of the input signal. Some examples of such basis functions include $$w_i = G_i(f_i(u))$$

where $f_i(u)$ may be a non-linear function of u, for example, $|u|^k$, and $G_i(\ )$ may be a linear time domain filtering.

In some examples, a set of basis functions is combined using a "balanced polynomial" form, which can be expressed as:

$$y[n] = \sum_k a_k \left( \left( \prod_i (w_i[n])^{b_{k,i}} \right) \left( \prod_j (w_i^*[n])^{c_{k,j}} \right) \right)$$

where $$\sum_i b_{k,i} = 1 + \sum_j c_{k,j}.$$

In some cases, the exponents $\{b_{k,i}\}$ and $\{c_{k,j}\}$ are predetermined, and the parameters $\Theta = \{a_k\}$ are determined, for example, using various approaches to system identification.

In some examples, the parameters for a device are determined prior to operation, for example, at a fabrication, manufacture, deployment, and/or periodic maintenance time, and then set for subsequent operation. In some examples, different sets of parameters are determined for different operating conditions (e.g., operating temperature, supply voltage, etc.), and in operation different sets of parameters are used according to sensing of the operating conditions. In some examples, external parameters such as temperature, supply voltage, output power, modulation mode, part age, sampling rate and part signature are inputs to a previously configured predictor unit. Based on these, the unit determines the regime of operation and outputs updated coefficients for the compensator. In some examples, the part signature is obtained by short fabrication-time characterization (e.g. few tones or a special transmit sequence).

One or more approaches described above have advantages including reduced operation-time computation complexity, thereby reducing power requirements and use of other computation-related resources, while providing relatively accurate linearization (e.g., relative to other approaches that use comparable computation resources). By using a structure of the pre-distorter that matches the non-linear structure of the circuit, the number of coefficients needed to accurately linearize the system is reduced and these parameters are more robust to variation of the system, thereby avoiding the need to continually update the parameters based on the observation of the output signals (e.g. p(t)). Note that the predictor can continuously update the coefficients in response to, for example, temperature changes, or supply voltage changes.

Other features and advantages of the invention are apparent from the following description, and from the claims.

DESCRIPTION

Figure 1:
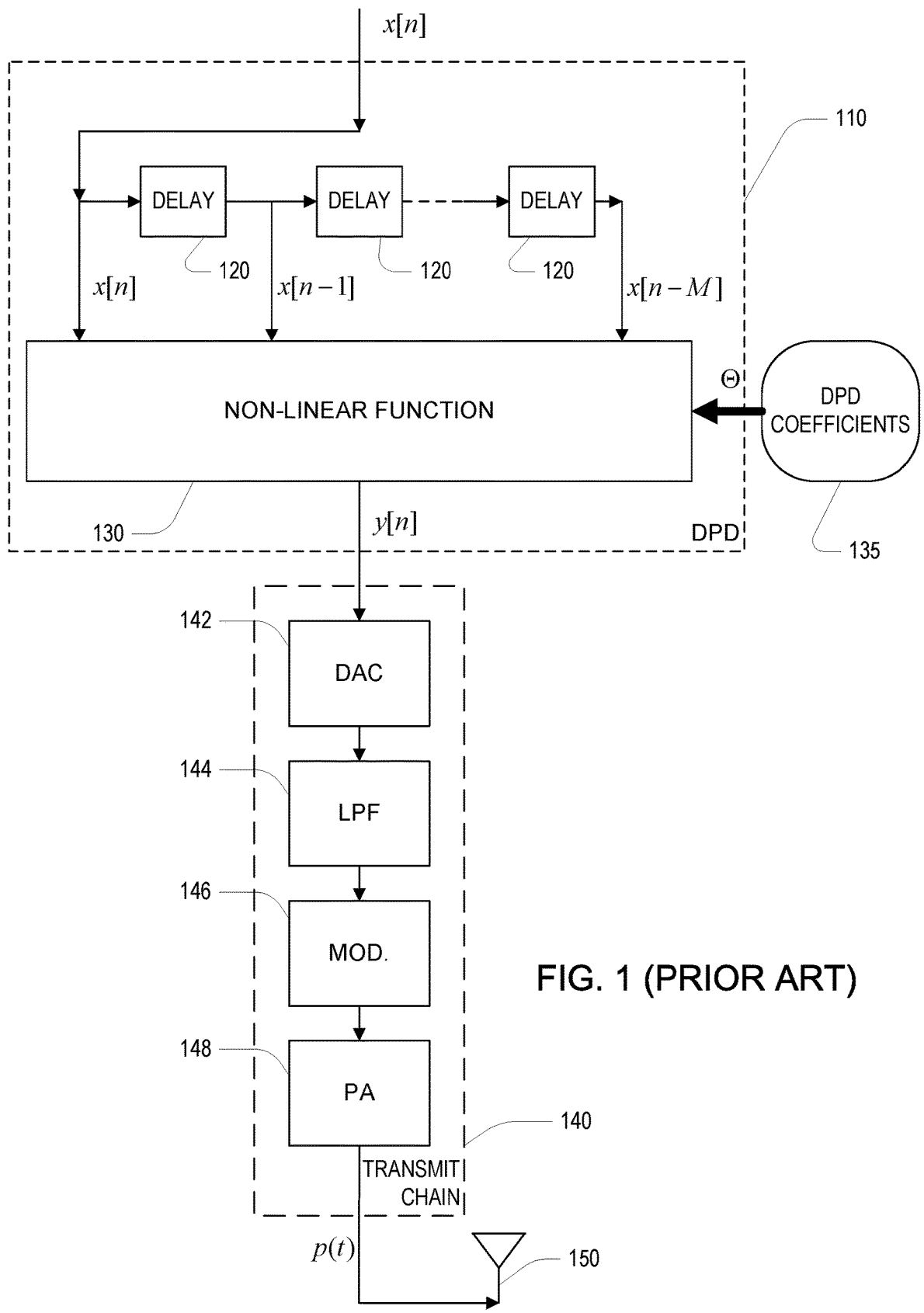
FIG. 1 is a block diagram of a conventional digital pre-distortion approach.
Figure 2:
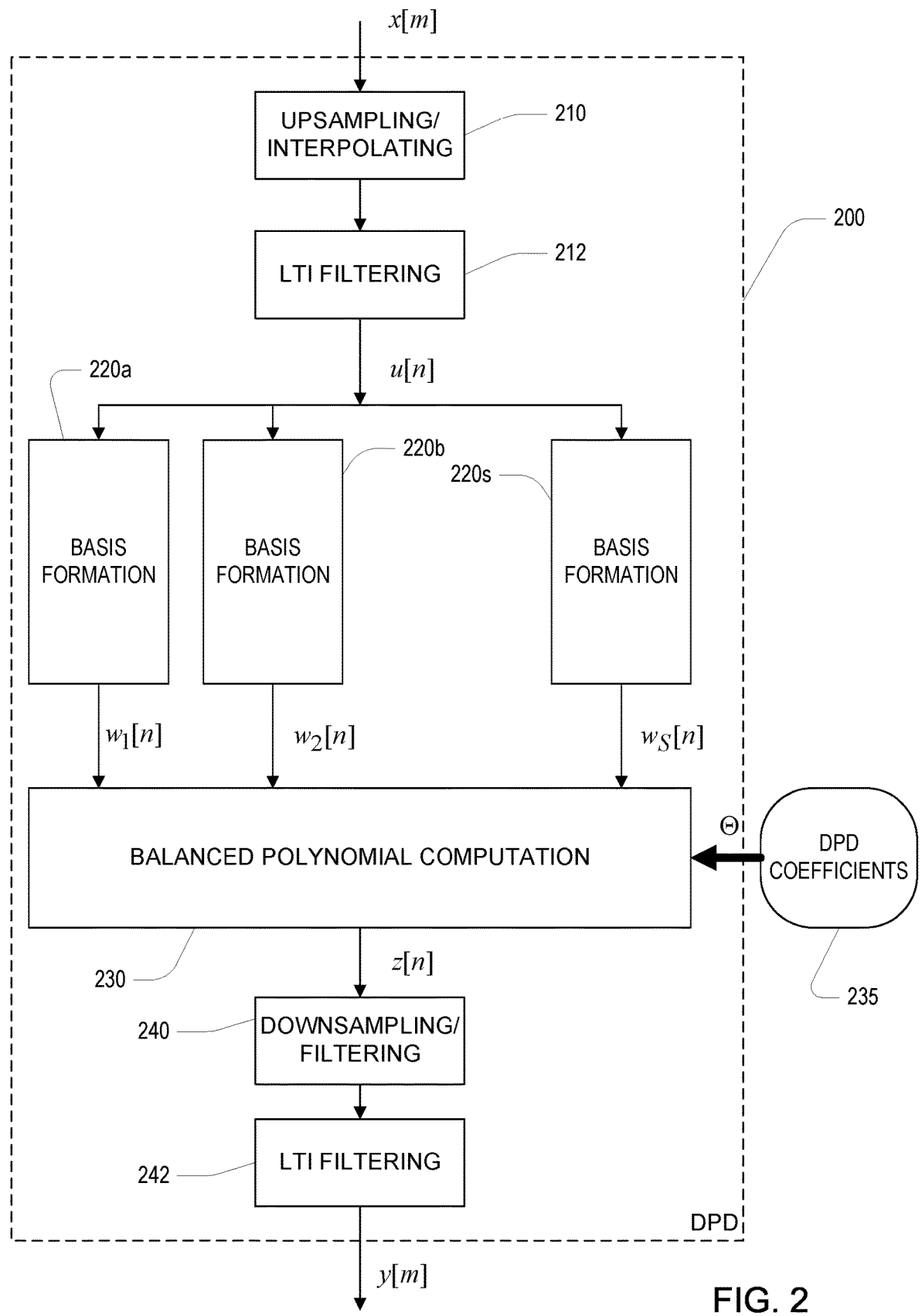
FIG. 2 is a block diagram representing a number of embodiments of the present approach.

Referring to FIG. 2, a first embodiment of a Digital Pre-Distorter 200 accepts a desired input signal x[m] in digital form (e.g., 12-14 bits per time sample), sampled at a sampling rate sufficient to represent the bandwidth (e.g., 20-120 MHz) of the desired signal. In general, the input signal is complex, with the real and imaginary parts representing quadrature components of the signal to be transmitted. For example, the desired input is a baseband encoding (e.g., an OFDM encoding) of one or more channels of communication, for instance, for a cellular telephone transmitter (e.g., according to an LTE communication standard). The input signal is upsampled using a conventional upsampling/interpolation component 210, for example, in some embodiments by a factor equal to one plus the degree of nonlinearity of interest in the transmit chain divided by two (e.g., if nonlinearity of interest is $7^{th}$ order, then upsampling by a factor of four is used), and then optionally filtered. Upsampling enables the DPD by shrinking the spectrum to avoid aliasing of undesirable harmonics in the target band.

In some examples, an optional LTI (Linear Time Invariant) filtering component 212 processes the signal after upsampling. The LTI filter is selected to "mimic" the long-term behavior of the elements of the transmit chain 140, for example, for the DAC 142, the LPF 144, etc. For example the fixed-coefficient reconstruction filter mimics the zero-order hold properties of the DAC. The upsampled and filtered input signal u(n) is then used to compute S basic signals, $w_1[n]$ through $w_s[n]$, each sampled at the upsampled rate, using a set of basis formation elements 220a-s, most of which represent non-linear transformations (e.g., polynomial function) of the input. The basis formation can incorporate polynomial function of the input, or alternatively non-polynomial function, for example, a polynomial $X|X|^2$, or a non-polynomial $(X|X|^2)/avg(|X|^2)$. The basis signals are applied to balanced polynomial computation element 230, or in alternative embodiments another form of non-linear combination, which outputs a combined signal z[n] at the upsampled rate. This combined signal is then downsampled in a downsampling/filtering component 240, and optionally further filtered in a LTI filtering component 242, for example, yielding the original sampling rate of the input signal x[m], to produce an output y[m] of the DPD 200.

Figure 3:
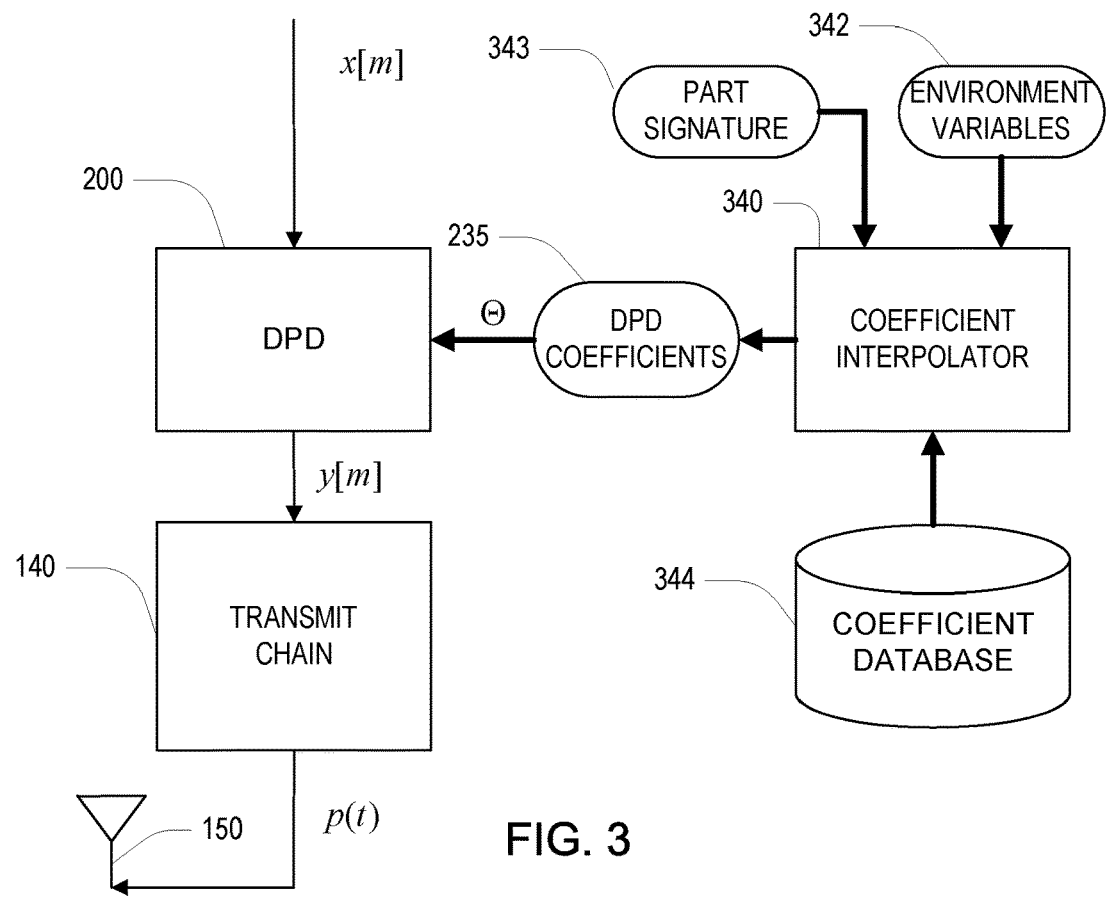
FIG. 3 is a block diagram illustrates a coefficient interpolation approach.

Referring to FIG. 3, in some embodiments, the output y[m] of the DPD 200 is passed through a transmit chain 140 to produce the driving signal p(t) for the antenna 150 of the transmitter. As shown in FIG. 2, the DPD 200, and more particularly the balanced polynomial computation is configured according to numerical parameters, the DPD coefficients Θ235. In this embodiment, these coefficients are determined using a database of coefficients 344, and values that essentially characterize the operation "regime" (i.e., a class of physical conditions) of the transmit chain. These values (e.g., quantitative or categorical digital variables) include environment variables 342 (e.g., temperature, transmitter power level, supply voltage, frequency band) and/or a part "signature" 343, which represents substantially invariant characteristics and which may be unique to the electronic parts of the transmit chain 140. The coefficient interpolator 340 takes these inputs and the coefficient database and outputs corresponding DPD coefficients 235. A variety of approaches may be implemented by the coefficient interpolator, including selection and/or interpolation of coefficient values in the database according to the inputs, and/or applying a mathematical mapping of the input represented by values in the coefficient database.

Figure 4:
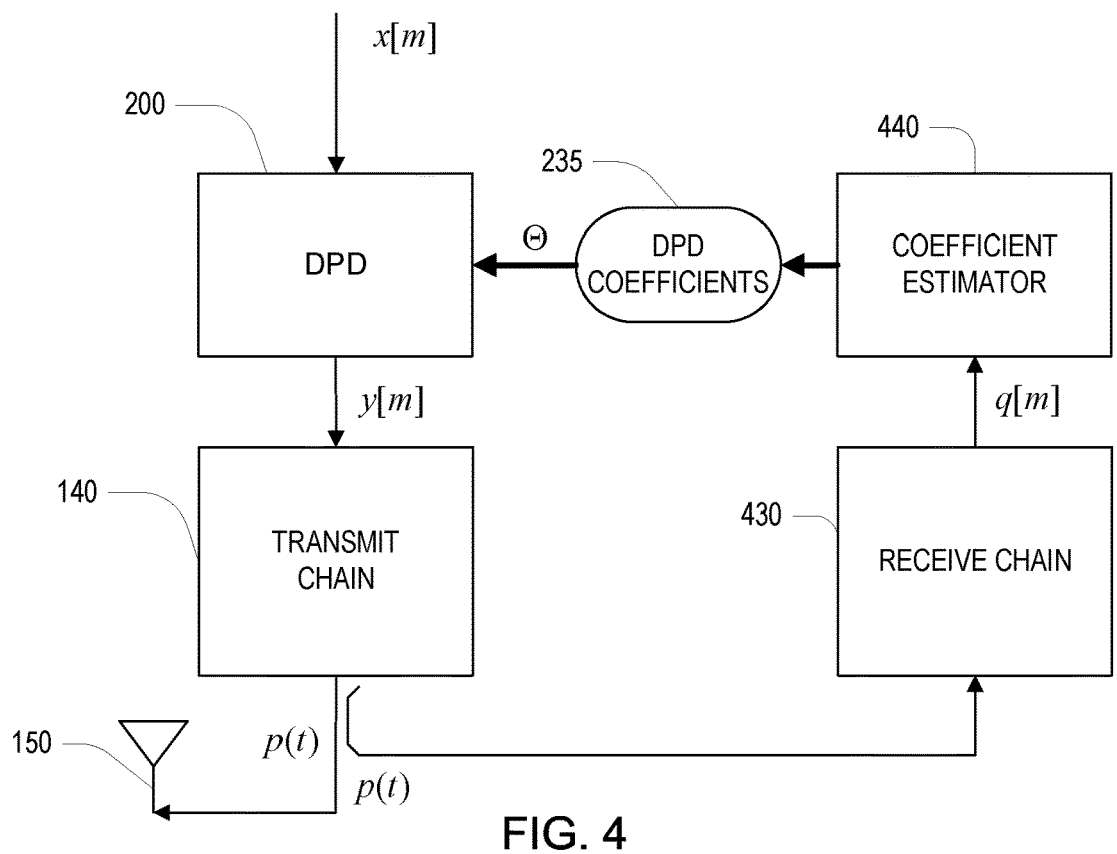
FIG. 4 is a block diagram that shows a operation-time parameter estimation approach.

Referring to FIG. 4, in another embodiment, the DPD coefficients 235 are determined during operation of the system by using a receive chain 430 processes a sensing of the output p(t), and though substantially linear demodulation, and digitization, produces a digital output q[m] at the same sampling interval as the input y[m] of the transmit chain. In some examples, the coefficients are adjusted in a substantially continuous manner during operation, while in other examples, the coefficients are updated relatively infrequently in batches (e.g., once an hour, day, etc.) using non-operational inputs. The determination of these parameters is discussed more fully below, and generally relies on sensing of an output of the transmit chain 140, and processing that sensed output using a receive chain 330, which is assumed to be substantially linear.

Figure 5:
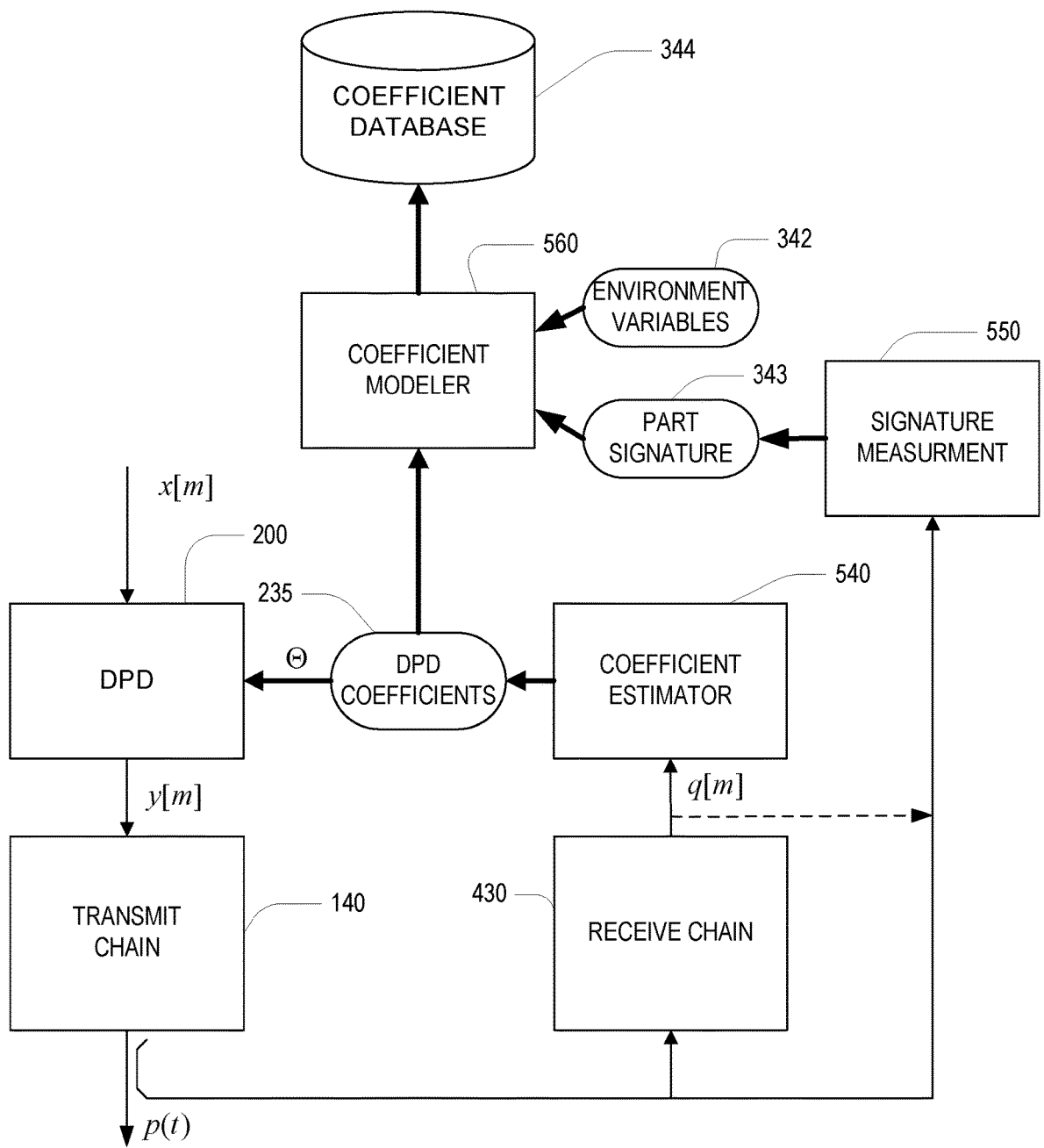
FIG. 5 is a block diagram that shows a pre-operation coefficient modeling approach.

Referring to FIG. 5, an approach to forming the coefficient database 344 (see FIG. 3) makes use of an analysis the transmit chain 140 prior to operational use. More generally, a set of instances of transmit chains (e.g., using separately manufactured parts) are analyzed to sample manufacturing and other part-to-part variations. Generally, different test signals x[m] are used to drive the transmit chain 140, and corresponding input y[m] and received output q[m] (i.e., after demodulating through the received chain 430), are used to estimate DPD coefficients 235 under various environmental conditions. The DPD coefficients 235 and corresponding environment variables 342 are provided to the coefficient modeler 560, which stores them (optionally pre-processing them, for example, for from a piecewise linear model) in the coefficient database 344.

Continuing to refer to FIG. 5, each instance of the transmit chain may be characterized by passing specific test signals through the transmit chain 140 and using a signature measurement module 550 to determine signature values (e.g., quantitative or categorical values) from those measurements. For example, multi-tone test signals may be passed through the transmit chain and the magnitude of distortion products may be measured and recorded as elements of the part signature. As part of the manufacturing or other pre-operational stage, the part signature for a transmit chain is provided in association with that transmit chain, and used in operation, for example, as part signature 343 as illustrated in FIG. 3. For example, the part signature may be stored on a computer readable medium (e.g., non-volatile semiconductor memory) in, coupled to, or otherwise associated with the transmit chain or its components. When used by the DPD 200, the part signature imparts specific functionality on the DPD instance to compensate for non-linearities of the specific instance of the transmit chain.

It should be understood that environment variables and signature variables may be used independently or in combination. Also, it should be understood that the coefficient interpolator 340 (e.g., FIG. 3) may implement various forms or interpolation or approximation as long as they are compatible with the coefficient modeler 560 (e.g., FIG. 5). Such techniques can include the use of a piecewise linear interpolation as a non-essential example. Other ways of mapping from the environment and signature variables include use of other piecewise smooth functions, kernel approach, etc.

Figure 6:
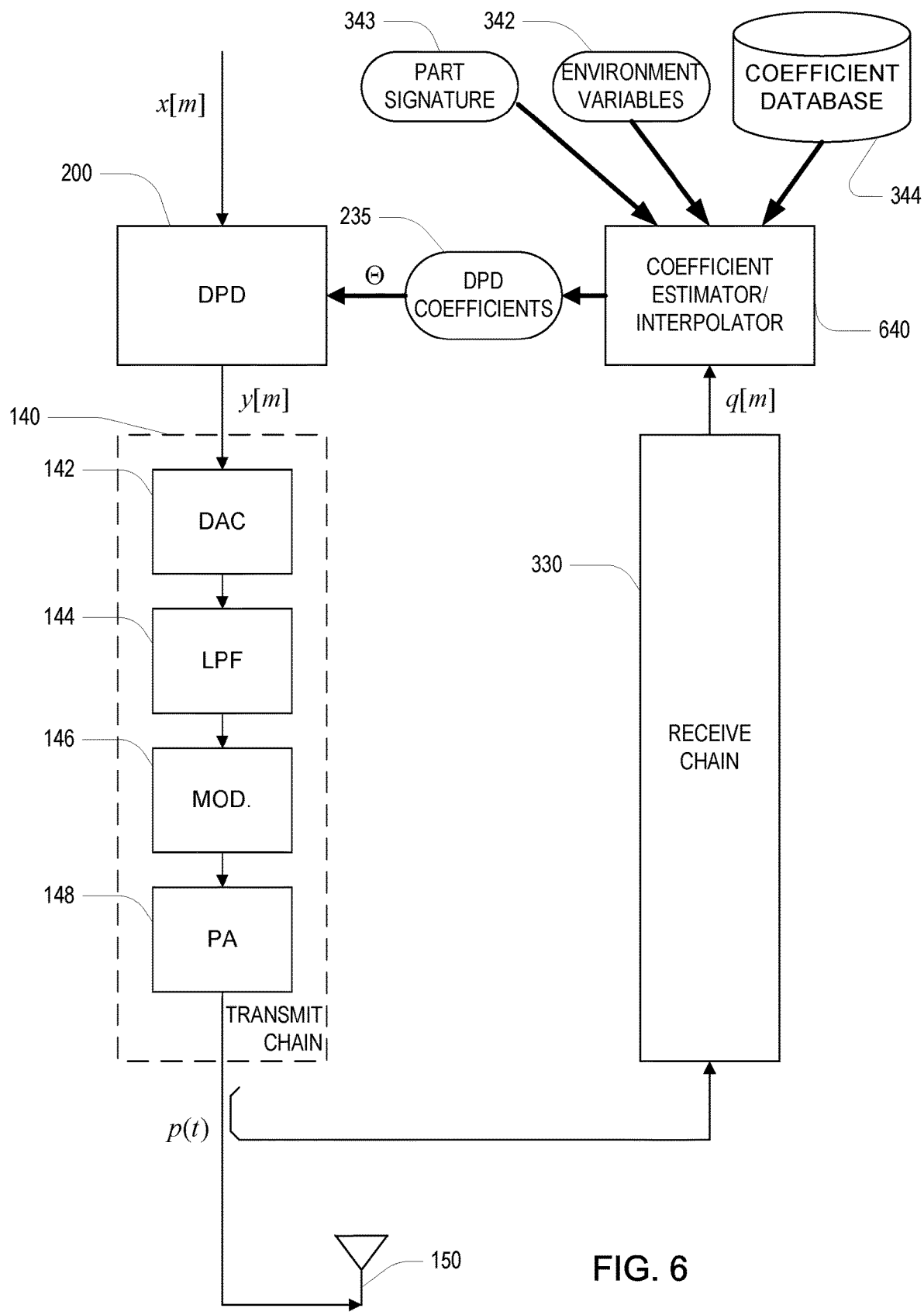
FIG. 6 is a block diagram showing a combined coefficient interpolation and operation time parameter estimation approach.

Referring to FIG. 6, yet another embodiment combines aspects shown in FIG. 3 and in FIG. 4, namely that the DPD coefficients 235 depend not only on an interpolation based on a coefficient database 344 and environment variables 342 and/or part signature 343, but also depend on feedback of sensed and demodulated via a receive chain 330 of the output of the transmit chain 140.

Figure 7:
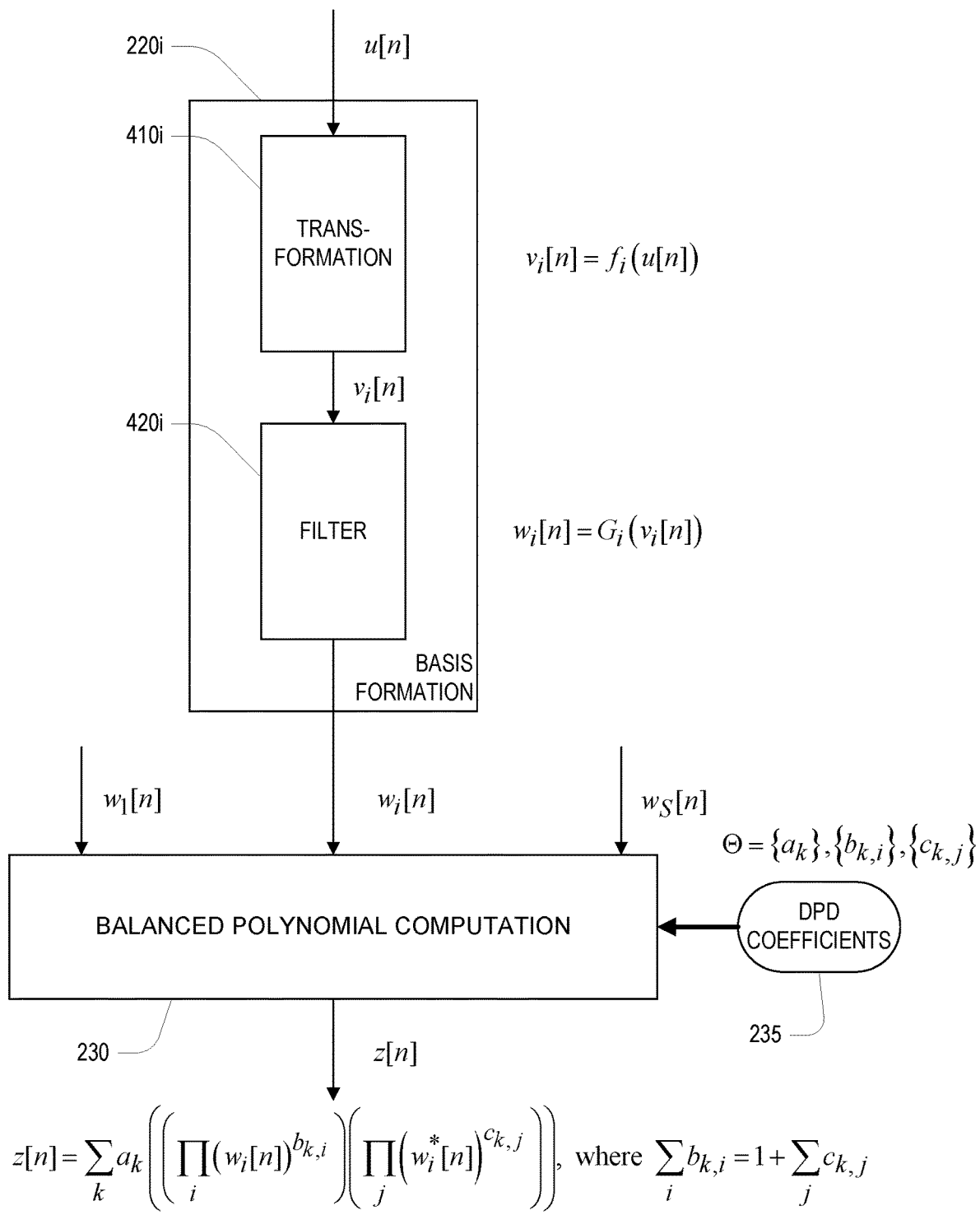
FIG. 7 is a block diagram of an exemplary basis formation and polynomial combination embodiment.

Referring to FIG. 7, and also referring back to FIG. 2, the set of basis formation elements 220a-s include elements that can be represented as basis formation element 220i shown in FIG. 7. Generally, each such basis formation element includes a representative transformation element 410i and a (e.g., LTI) filter element 420i. The transformation elements are generally non-linear (e.g., polynomial) and memoryless, represented as $v_i[n]=f_i(u[n])$. Various functional forms may be used, for example, $f(u)=|u|^2$, $f(u)=|u|^3$, $f(u)=u|u|^2$, etc. The filter elements are generally linear and time invariant (LTI), for example, implementing one-pole or two-pole linear infinite-impulse-response (IIR) filters. For example, the poles of such filters may correspond to time constants of 1 to 4 samples and Q factors of 10. In general, at least some of the basis transformations include transformations (i.e., $v_i[n]=u[n]$) and/or pure delay filters (i.e., $w_i[n]=v_i[n-\tau]$) for one or more values of $\tau$.

Continuing to refer to FIG. 7, in some examples, the non-linear combination of the basis functions uses a balanced polynomial computation element 230, which can be represented in a general form as:

$$y[n] = H(w_1[n], \ldots, w_S[n]) = \sum_k a_k \left( \left( \prod_i (w_i[n])^{b_{k,i}} \right) \left( \prod_j (w_i^*[n])^{c_{k,j}} \right) \right)$$

where for $w=a+jb$, where $j=\sqrt{-1}$, and $w^*=a-jb$ represents the complex conjugate of w, and therefore $w\,w^*=|w|^2$, and where for each term (k) the degree $(\Sigma_i b_{k,i})$ of the non-conjugated terms is one greater than the degree $(\Sigma_j c_{k,j})$ of the conjugated terms, that is $$\sum_i b_{k,i} = 1 + \sum_j c_{k,j}$$

Examples of such functions include $H(w_1, w_2)=|w_1|^2 w_2 - 3w_1^2 w_2^*$ (i.e., $a_1=1$, $a_2=-3$, $b_{1,1}=1$, $b_{1,2}=1$, $c_{1,1}=1$, $c_{1,2}=0$, $b_{2,1}=2$, $b_{2,2}=0$, $c_{2,1}=0$, $c_{2,2}=1$) and $H(w_1, w_2, w_3)=-jw_1 w_1 w_2^* + w_3$.

Figure 8:
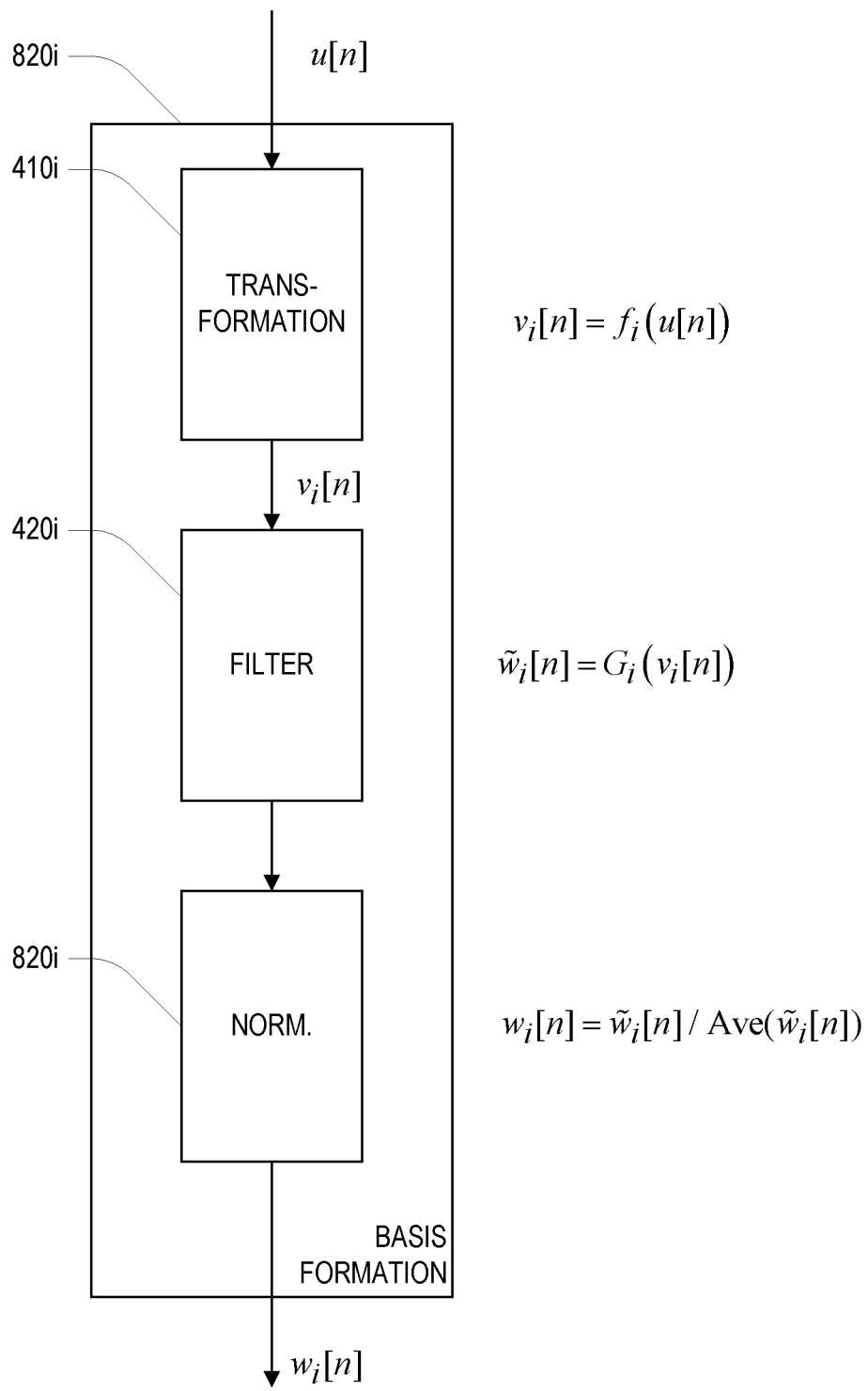
FIG. 8 is a block diagram of an alternative basis formation approach incorporating normalization.

Referring to FIG. 8, in some embodiments, some or all of the basis formation blocks 220a-s may use "non-polynomial" forms. For example, as illustrated in FIG. 8, a normalization block 820i may be used to normalize a basis value by dividing by an average value (e.g., a long time scale decaying average). It should be recognized that this type of normalization is only an example of a non-polynomial form of basis formation.

Referring back to FIG. 2, the output z[n] is then down-sampled and filtered, for example, to the original sampling rate of the input x[m] to yield the output y[m]. In some examples, this downsampling may be omitted, or the sampling rate of the output may be between the sampling rate of the input and the upsampled rate. In some examples, an optional LTI filtering stage 242 is applied at the output of the DPD 200 prior to passing the signal to the transmit chain.

The structure of the DPD described above is robust to variation during operation and does not necessarily have to be adapted quickly during operation in order to maintain the linearization of the system. For example, the parameters for the DPD may be estimated once for long periods of operation, for example, being estimated during manufacturing or deployment of the system.

Referring back to FIG. 5, in an approach to estimation of the parameters Θ for the DPD, a receive chain 330 processes a sensing of the output p(t), and though substantially linear demodulation, and digitization, produces an digital output q[m] at the same sampling rate as the input y[m] of the transmit chain. Note that as introduced above, this estimation may be uses as part of formation of the coefficients of the database 344, and may also be used in operational adjustment of the coefficients as illustrated in FIGS. 4 and 6.

In some examples, data comprising input to the transmit chain, y[m], and corresponding sensed (i.e., including demodulation) output of the transmit chain, q[m], are collected in a series of iterations, with the parameters $\Theta=\{a_k\}$ being determined from the collected data. In some examples, the collected data sequences $e_{K-1}[m]$, representing the pre-distortion added to the original signal, are obtained through iterations as follows:

Assume $g_0[m]=y_0[m]+e_0[m]$, where $y_0[m]$ is the original signal sequence without the pre-distortion.
Iterate the training sequence $y_1[m]=y_0[m]-e_0[m]$, and find $e_1[m]=q_1[m]-y_0[m]$.
Continue iterating $y_k[m]=y_0[m]-e_{k-1}[m]$, and find $e_k[m]=q_k[m]-y_0[m]$, for $k=2,3,\ldots$.
After a final iteration (K), the pre-distorter is configured such that for an input $q_k[m]=y_0[m]+e_k[m]$ the predistorter produces an output $y_K[m]=y_0[m]-e_{K-1}[m]$ In an alternative approach, the nonlinear transformation of $y_0[m]$ to yield $q_0[m]$ is used to characterize the transmit chain (e.g., according to a different parameterization than is used for the pre-distorter). The parameters $\Theta=\{a_k\}$ are then determined to best "invert" the estimated characteristics of the transmit chain.

In some implementations, the parameters $\Theta$ are determined based on a predictor, which accepts parameters, for instance, temperature, power supply voltage (Vdd), sampling rate, modulation mode, frequency band, part signature (e.g., obtained by short in-fab part characterization using a few tones or a special transmit sequences), and part age. Based on these, the predictor unit determines the regime of operation for the compensator and outputs updated coefficients for the compensator and selects parameters of a predetermined set of parameters.

Implementations of the approaches described above may use hardware, software, or a combination of hardware and software. Software may include instructions for a general purpose, a special purpose processor or a heterogeneous processor, with the instructions being stored on a non-transitory machine readable medium and read from the medium for execution by the processor. The instructions may be machine level, or may be represented in programming language form. In some examples, at least some of the transmit chain is implemented in software, and the DPD approach is implemented as further software executed on the sample signal processor or system that implements that part of the transmit chain. In some examples, the software is executed on a processor specifically dedicated to implementation of the DPD.

At least some implementations of the DPD make use of circuitry, which generally includes circuitry for digital signal processing (e.g., arithmetic computation circuitry) which may be dedicated (e.g., as application specific integrated circuits, ASICs, or Field-Programmable Gate Arrays) to particular functions described above and/or may be controlled by software instructions that implement the functions. In some implementations, a computer accessible storage medium includes a database representative of some or all of a DPD 200. Generally speaking, a computer accessible storage medium may include any non-transitory storage media accessible by a computer during use to provide instructions and/or data to the computer. For example, a computer accessible storage medium may include storage media such as magnetic or optical disks and semiconductor memories. Generally, the database representative of the system may be a database or other data structure which can be read by a program and used, directly or indirectly, to fabricate the hardware comprising the system. For example, the database may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the DPD The netlist may then be placed and routed to either produce the configuration bitfile for the Field-Programmable Gate Array or produce a data set describing geometric shapes to be applied to masks. The masks may then be used in various semiconductor fabrication steps to produce a semiconductor circuit or circuits corresponding to the DPD In other examples, Alternatively, the database may itself be the netlist (with or without the synthesis library) or the data set It is to be understood that the foregoing description is intended to illustrate and not to limit the scope of the invention, which is defined by the scope of the appended claims. Other embodiments are within the scope of the following claims.

What is claimed is:

1. A method for digital predistortion of an input signal for application to a circuit exhibiting non-linear characteristics, the method comprising:
   accessing a plurality of coefficient values from a stored database of coefficients;
   receiving the input signal representing a desired signal for emission via the circuit;
   forming a plurality of non-linear transformations of the input signal;
   determining values of a plurality of measurement variables, the measurement variables including at least one of (a) an environmental variable, (b) a device signature variable, and (c) a feedback variable received from the device based on prior emission of a signal from the device;
   processing the plurality of coefficient values according to the plurality of measurement variables to determine a plurality of predistortion parameters, including interpolating coefficient values according to the measurement variables to yield at least some of the predistortion parameters;
   forming a predistorted signal for input to the circuit, including combining the non-linear transformations and the coefficient values to form the predistorted signal; and
   providing the predistorted signal for input to the circuit.

2. The method of claim 1, wherein the coefficient values remain fixed during operation of the circuit.

3. The method of claim 1, wherein interpolating the coefficient values according to the measurement variables includes at least one of (a) linear interpolation, (b) piecewise linear interpolation, (c) piecewise smooth function interpolation, and (d) kernel-based interpolation, of the coefficient values.

4. The method of claim 1, wherein interpolating the coefficient values according to the measurement variables includes applying a mathematical mapping to the measurement variables, wherein the mathematical mapping is represented by the coefficient values.

5. The method of claim 1, wherein the determining of the values of the measurement variables, the processing of the coefficient values, and forming of the predistorted signal are repeated for successive portions of the input signal.

6. The method of claim 5 wherein the coefficient values remain fixed over the repetitions for the successive portions of the input signal.

7. The method of claim 1, wherein forming the non-linear transformations comprises upsampling the input signal and forming the non-linear transformations based on the upsampled input signal.

8. The method of claim 1, wherein forming the non-linear transformations comprises forming at least some of the non-linear transformations as polynomial functions of the input signal.

9. The method of claim 7, wherein forming the non-linear transformations further comprises forming at least some other of the non-linear transformations as non-polynomial functions of the input signal.

10. The method of claim 1, wherein forming the non-linear transformations comprises time-domain filtering at least one non-linear transformation of the input signal.

11. The method of claim 1, wherein forming the non-linear transformations comprises includes forming at least one degree-1 product of terms, each term including (a) the input signal, (b) a delayed version of the input signal, (c) a complex conjugate of the input signal, or (d) a delayed version of the input signal, raised to a respective integer power for the term.

12. The method of claim 11, wherein combining the non-linear transformations and the coefficient values includes computing a value of a balanced polynomial function.

13. The method of claim 1, wherein the measurement variables include (a) the environmental variable.

14. The method of claim 13, further comprising measuring said environmental variable, said environmental variable including a variable from a group consisting of a temperature, a supply voltage to the circuit, a transmit power, a modulation mode, a part age, a sampling rate, and a frequency band.

15. The method of claim 1, wherein the measurement variables include (b) the device signature variable.

16. The method of claim 15, further comprising obtained obtaining a value of the device signature variable by providing a plurality of test inputs to the device.

17. The method of claim 1, wherein the measurement variables include (c) a feedback variable received from the device based on prior emission of the signal from the device.

18. The method of claim 17, further comprising determining a value of the feedback variable including demodulating a radio-frequency output from the circuit in response to an input to the circuit.

* * * * *